(12) United States Patent
Nagai et al.

(10) Patent No.: US 7,560,740 B2
(45) Date of Patent: Jul. 14, 2009

(54) LIGHT-EMITTING DEVICE

(75) Inventors: Youichi Nagai, Osaka (JP); Koji Katayama, Itami (JP); Hiroyuki Kitabayashi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 526 days.

(21) Appl. No.: 11/361,144

(22) Filed: Feb. 23, 2006

(65) Prior Publication Data

US 2006/0237732 A1  Oct. 26, 2006

(30) Foreign Application Priority Data

Apr. 26, 2005 (JP) ............................. 2005-128245

(51) Int. Cl.
*H01L 33/00* (2006.01)
(52) U.S. Cl. .................................. 257/95; 257/E33.067
(58) Field of Classification Search .................. 257/95, 257/103, E33.025, E33.067
See application file for complete search history.

(56) References Cited

U.S. PATENT DOCUMENTS

| | | | | |
|---|---|---|---|---|
| 2002/0123164 A1* | 9/2002 | Slater et al. | .................. | 438/39 |
| 2002/0185054 A1* | 12/2002 | Xu et al. | .................. | 117/2 |
| 2005/0062060 A1* | 3/2005 | Nagai et al. | .................. | 257/100 |
| 2005/0227379 A1* | 10/2005 | Donofrio | .................. | 438/4 |

FOREIGN PATENT DOCUMENTS

| | | |
|---|---|---|
| JP | 03-035568 | 2/1991 |
| JP | 03-129882 | 6/1991 |
| JP | 09-237918 | 9/1997 |
| JP | 10-341035 | 12/1998 |
| JP | 2000-044400 | 2/2000 |
| JP | 2002-319708 | 10/2002 |
| JP | 2002-368261 | 12/2002 |
| JP | 2004-056088 A | 2/2004 |
| JP | 2004-087930 A | 3/2004 |
| JP | 2004-103672 | 4/2004 |
| JP | 2004-253743 | 9/2004 |
| JP | 2005-019874 | 1/2005 |
| JP | 2005-064426 | 3/2005 |

* cited by examiner

*Primary Examiner*—Thomas L Dickey
(74) *Attorney, Agent, or Firm*—Darby & Darby PC

(57) ABSTRACT

A light-emitting device is presented which includes a GaN substrate 1; an n-type nitride semiconductor substrate layer (n-type $Al_xGa_{1-x}N$ layer 3) disposed on a first main surface side of the GaN substrate 1; a p-type nitride semiconductor substrate layer (p-type $Al_xGa_{1-x}N$ layer 5) disposed further away from the GaN substrate 1 compared to the n-type nitride semiconductor substrate layer; and a light-emitting layer (multi-quantum well (MQW) 4) positioned between the n-type nitride semiconductor layer and the p-type nitride semiconductor layer. The p-type nitride semiconductor layer side is down-mounted. Also, light is released from a second main surface 1a, which the main surface opposite from the first main surface of the GaN substrate 1. A groove 80 is formed on the second main surface of the GaN substrate 1. The inner perimeter surface of the groove 80 includes a section (curved surface section) on which surface treatment is performed to smooth the inner perimeter surface.

7 Claims, 10 Drawing Sheets

LIGHT-EMITTING DEVICE

INCORPORATION BY REFERENCE

The present application claims priority under 35 U.S.C. §119 to Japanese Patent Application No. 2005-128245 filed on Apr. 26, 2005 in the Japanese language, which is hereby incorporated by reference in its entirety.

BACKGROUND OF THE INVENTION

1. Field of the Invention

The present invention relates to a light-emitting device, a method for making the same, and a nitride semiconductor substrate. More specifically, the present invention relates to a light-emitting device formed from a nitride semiconductor, a method for making the same, and a nitride semiconductor substrate. In the present invention, "light-emitting device" may refer to a semiconductor element formed essentially from a nitride semiconductor substrate and a semiconductor layer laminated thereon, or may refer solely to a device sealed in resin in which a semiconductor chip is mounted on a mounting part. Furthermore, the term may refer to both of these meanings at the same time. Also, a semiconductor chip may be referred to simply as a "chip". Also, in a chip, a substrate and an epitaxial layer formed thereon may be referred to simply as a "substrate".

2. Description of the Background Art

White light-emitting diodes (LEDs) are currently widely used for illumination in compact electronic devices such as portable information terminals, but there is the promise that these diodes may be used in the future for illumination of large spaces or areas. In order to allow use in large spaces or large areas, the LED light output must be increased.

One method for significantly increasing light output is to efficiently output the light generated within the LED to the outside, i.e., to improve the light extraction efficiency. Examples of technologies for improving light extraction efficiency in this manner include: a light-emitting device in which a groove is formed from the surface of a nitride semiconductor layer to a substrate near a p-electrode formed on a nitride semiconductor layer laminated on the substrate (see Japanese Laid-Open Patent Publication No. 2004-87930); and a light-emitting device in which a light reflection surface is formed on a back surface of a substrate opposite from a surface on which a nitride semiconductor layer is laminated (e.g., see Japanese Laid-Open Patent Publication No. 2004-56088).

Japanese Laid-Open Patent Publication No. 2004-87930 described above gives as examples of methods for forming grooves: dry etching; wet etching; an optical method involving a laser; and mechanical methods involving dicers, scribers, or the like. Also, Japanese Laid-Open Patent Publication No. 2004-56088 above describes the forming the reflection surface on the back surface of the substrate as a groove with a V-shaped cross-section using a dicer.

These conventional technologies, however, have the following problems. If etching is used to form grooves, an adequately high etching rate cannot be used, although this depends on the material used in the nitride semiconductor substrate. In such cases, forming deep grooves within a practical etching time is difficult. Also, when etching is used to form grooves, controlling groove shape (e.g., the angle formed at the bottom of the groove between the facing side walls) is difficult.

If grooves are formed with a mechanical method such as with a dicer, the dicing surface (i.e., the side walls of the groove) acquires a layer damaged by processing or a region with damaged crystal planes. When this happens, adequate emission of light from the side wall surfaces of the groove becomes difficult due to the influence of the altered layer or the like. As a result, adequate improvement of light extraction efficiency in the light-emitting device is made difficult.

The object of the present invention is to overcome these problems and to provide a light-emitting device with improved light extraction efficiency, a method for making the same, and a nitride semiconductor substrate that can be used in making the same.

SUMMARY OF THE INVENTION

A light-emitting device according to the present invention is a light-emitting device including: a nitride semiconductor substrate; an n-type nitride semiconductor layer on a first main surface side of the nitride semiconductor substrate; a p-type nitride semiconductor layer positioned further from the nitride semiconductor substrate compared to the n-type nitride semiconductor layer; and a light-emitting layer positioned between the n-type nitride semiconductor layer and the p-type nitride semiconductor layer. The p-type nitride semiconductor layer side is down-mounted and light is released from a second main surface, which is a main surface opposite from the first main surface of the nitride semiconductor substrate. A groove is formed on the second main surface of the nitride semiconductor substrate. An inner perimeter surface of the groove undergoes surface treatment in order to smooth the inner perimeter surface.

Since a groove 80 is formed on the second main surface, which is the light exit surface of the nitride semiconductor substrate, light can be extracted from the side walls of the groove 80 as well. As a result, light usage efficiency of the light-emitting device can be improved.

Furthermore, since the groove formed on the second main surface, which is the light exit surface, includes a section on which surface treatment was performed in order to smooth the inner perimeter surface of the groove, even if a layer that was damaged during processing or a region with crystal face damage or the like is formed when the groove is formed on the second main surface, this surface treatment operation can improve or remove the processing-damage layer or region with crystal face damage. (For example, when the surface treatment involves removing a certain thickness from the surface layer of the second main surface, including the inner perimeter surface of the groove, in order to smooth the inner perimeter surface of the groove, these processing-damage layers or regions with crystal face damage can be removed.) As a result, the reduction of light extraction efficiency from the second main surface caused by a processing-damage layer or the like can be prevented.

A light-emitting device according to the present invention is a light-emitting device including: a nitride semiconductor substrate; an n-type nitride semiconductor layer on a first main surface side of the nitride semiconductor substrate; a p-type nitride semiconductor layer positioned further from the nitride semiconductor substrate compared to the n-type nitride semiconductor layer; and a light-emitting layer positioned between the n-type nitride semiconductor layer and the p-type nitride semiconductor layer. The p-type nitride semiconductor layer side is down-mounted and light is released from a second main surface, which is a main surface opposite from the first main surface of the nitride semiconductor substrate. A side surface of the nitride semiconductor substrate includes a sloped surface sloped relative to the second main surface. Surface treatment is applied to the sloped surface in order to smooth the sloped surface.

Since a sloped surface is formed on the second main surface, which is the light exit surface, of the nitride semiconductor substrate, light can be extracted from the sloped surface in a direction perpendicular to the second main surface. As a result, light usage efficiency of the light-emitting device can be improved.

Furthermore, since the sloped surface includes sections on which surface treatment is performed in order to improve the sloped surface, if processing-damage layers, regions with crystal face damage, and the like were formed when the sloped surface was formed, the surface treatment described above can improve or remove these processing-damage layers or regions with crystal face damage. As a result, it is possible to prevent the reduction in the light extraction efficiency caused by the sloped surface to processing-damage layers or the like.

A method for making the light-emitting device described above is a method for making a light-emitting device equipped with a nitride semiconductor substrate and includes a step for forming a groove and a step for performing surface treatment. In the step for forming a groove, dicing is performed on a second main surface opposite from a first main surface of the nitride semiconductor substrate upon which a light-emitting layer is formed. In the step for performing surface treatment, an inner perimeter surface of the groove is smoothed. As a result, the light-emitting device of the present invention can be obtained.

In a nitride semiconductor substrate according to the present invention: a groove is formed on one main surface; and an inner perimeter surface of the groove includes a section on which surface treatment is performed in order to smooth the inner perimeter surface.

As a result, when the nitride semiconductor substrate is used in a light-emitting device, and a main surface on which the groove is formed is used as the light exit surface, it is possible to obtain a light-emitting device with high light extraction efficiency.

DETAILED DESCRIPTION OF THE INVENTION

Figure 1:
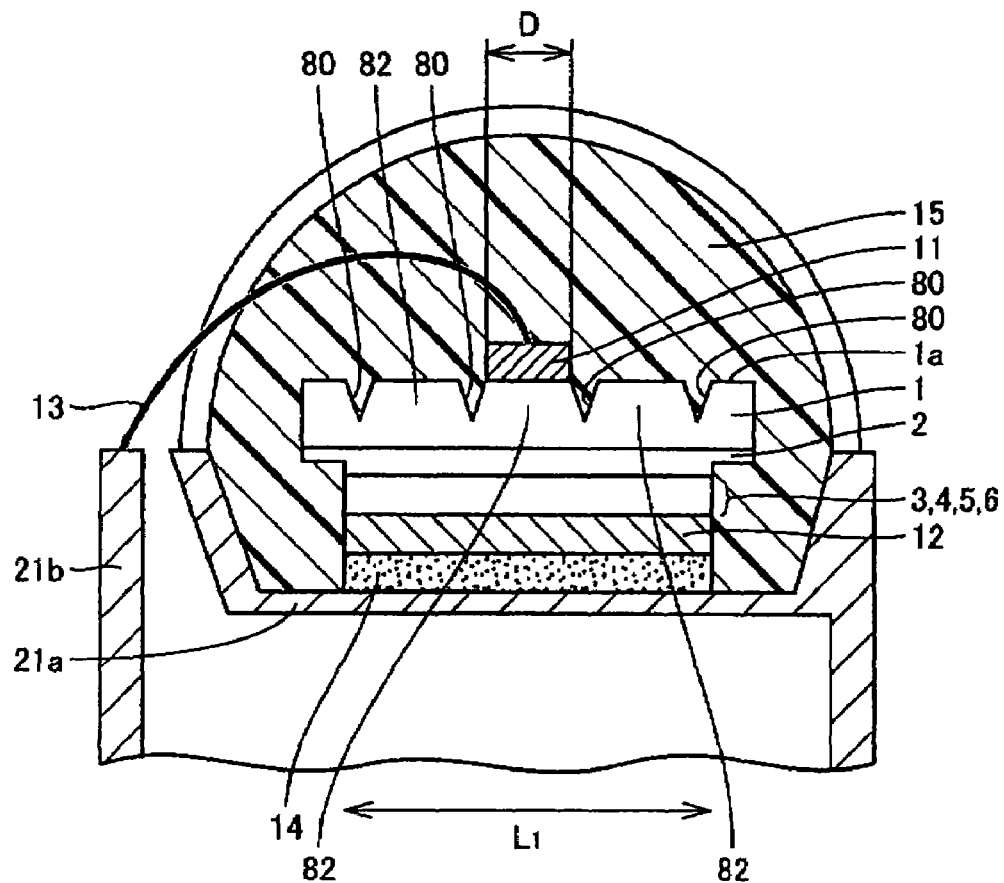
FIG. 1 shows a first embodiment of an LED serving as a light-emitting device according to the present invention.

Next, embodiments and examples of the present invention will be described using figures. In the following figures, like or associated elements are assigned like reference numerals and corresponding descriptions will not be repeated.

FIRST EMBODIMENT

Figure 2:
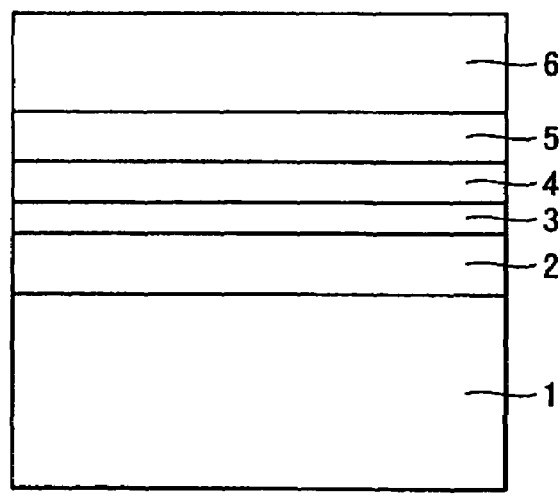
FIG. 2 shows a layered structure including a light-emitting layer of the LED in FIG. 1.

FIG. 1 shows a first embodiment of an LED serving as a light-emitting device according to the present invention. FIG. 2 shows a layered structure containing a light-emitting layer of the LED in FIG. 1. The first embodiment of an LED according to the present invention will be described using FIG. 1 and FIG. 2.

As shown in FIG. 1, a layered structure containing a light-emitting layer described in detail later is formed on a first main surface side of a GaN substrate 1, and a p-electrode 12 is disposed thereon. In this embodiment, p-electrode 12 is down-mounted using a conductive adhesive 14 on a lead-frame mount 21a.

A second main surface 1a of the GaN substrate 1 is a surface that releases light from the light-emitting layer, and a n-electrode 11 is disposed on this surface. Multiple grooves 80 extending parallel to each other and perpendicular to the figure plane of FIG. 1 are formed on the second main surface 1a. The n-electrode 11 is formed on a flat section of the second main surface 1a between the grooves 80 and does not cover the entire surface of the second main surface. The n-electrode 11 is disposed at roughly the center of the second main surface 1a. It is important that the section not covered by the n-electrode 11 is proportionally large. By making the opening ratio large, the light obstructed by the n-electrode is reduced, making it possible to increase the release efficiency of the light released outside.

The n-electrode 11 is electrically connected to a lead section 21b of the lead frame using a wire 13. The wire 13 and the layered structure described above are sealed with an epoxy-based resin 15 serving as a sealing member. Of the above structure, FIG. 2 shows a detail of the layered structure from the GaN substrate 1 to the p-electrode 12. In FIG. 2, the layered structure is shown vertically inverted relative to FIG. 1.

Referring to FIG. 2, a n-type GaN epitaxial layer 2 is positioned on the GaN substrate 1, and an n-type $Al_xGa_{1-x}N$ layer 3 is formed thereon. On top of this, is formed a multi-quantum well (MQW) 4 formed from an $Al_xGa_{1-x}N$ layer and an $Al_xIn_yGa_{1-x-y}N$ layer. A p-type $Al_xGa_{1-x}N$ layer 5 is disposed between the multi-quantum well 4 and the $Al_xGa_{1-x}N$ layer 3. Also, a p-type GaN layer 6 is disposed on the p-type $Al_xGa_{1-x}N$ layer 5. In this structure, light is emitted at the multi-quantum well 4. Also, as shown in FIG. 1, the p-electrode 12 is formed and down-mounted on the p-type GaN layer 6 so that the entire upper surface of the p-type GaN layer 6 is covered.

Figure 3:
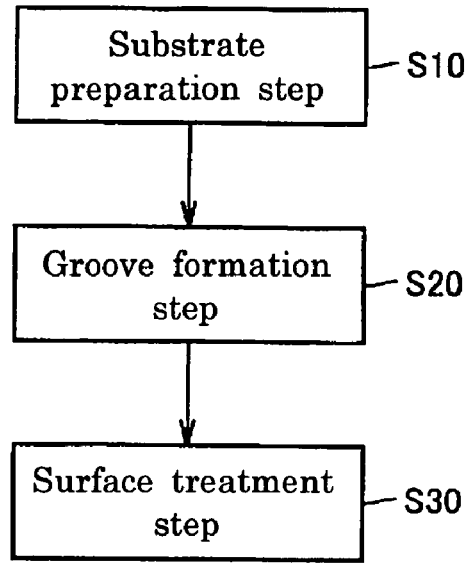
FIG. 3 is a flowchart illustrating a method for making a chip used in the LED shown in FIG. 1 and FIG. 2.
Figure 4:
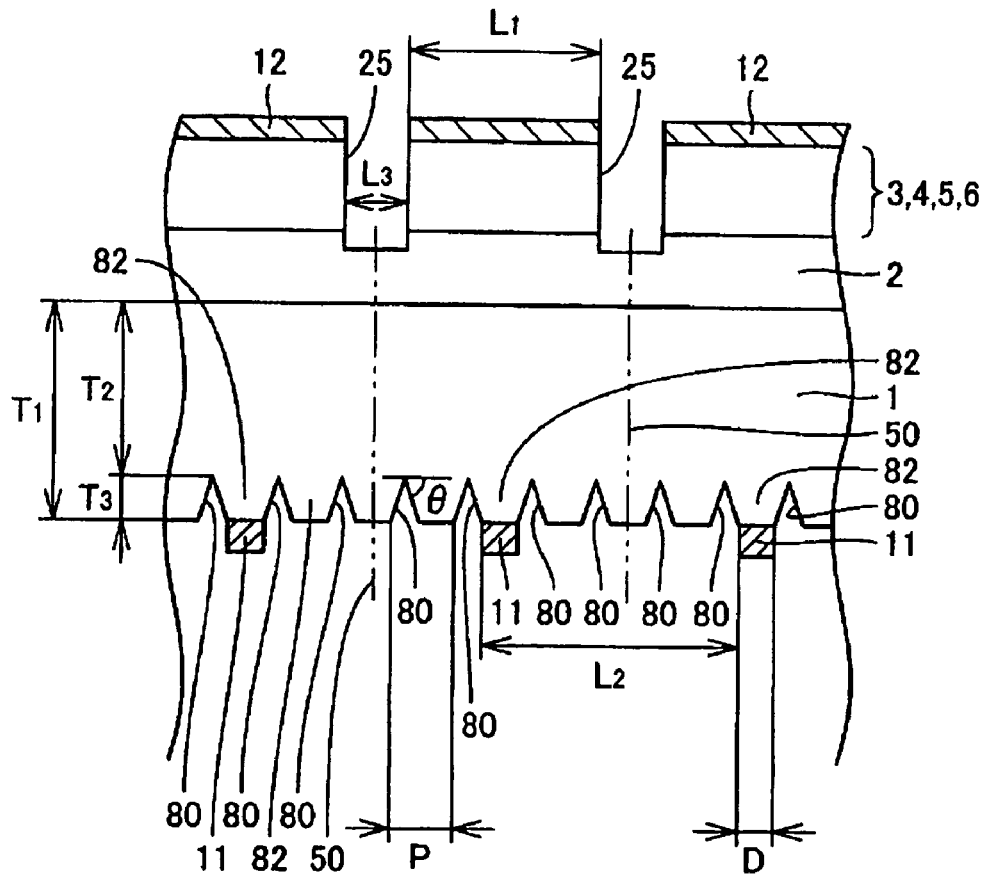
FIG. 4 shows the state of a wafer when chips having the layered structure shown in FIG. 2 are obtained from the wafer.
Figure 5:
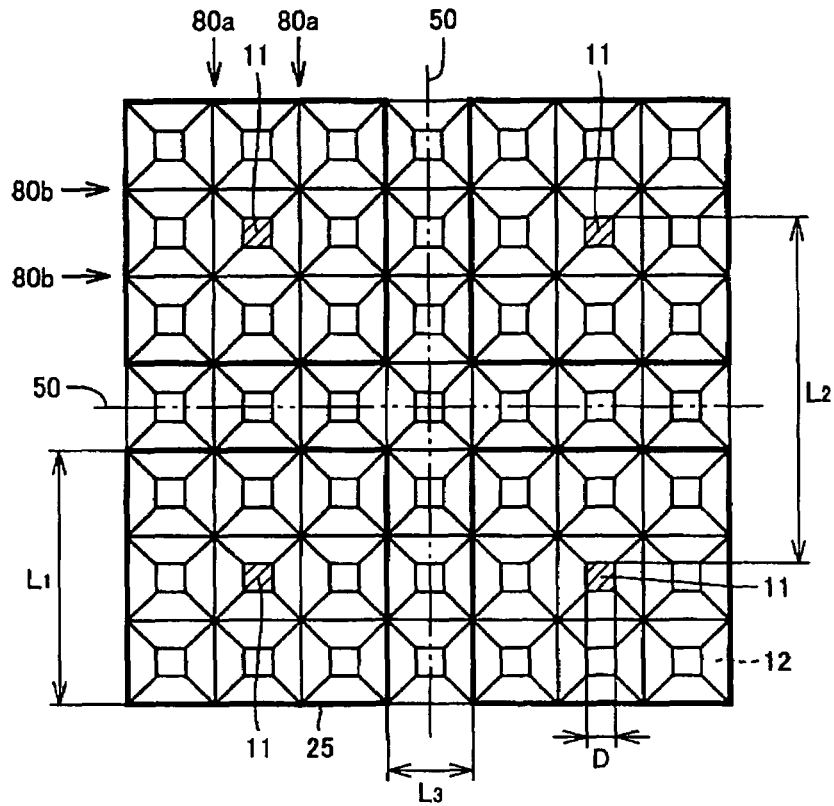
FIG. 5 shows the arrangement of the electrodes shown in FIG. 4.

Next, referring to FIG. 3 through FIG. 5, a method for making the LED shown in FIG. 1 and FIG. 2 will be described briefly. FIG. 3 is a flowchart illustrating a method for making a chip used in the LED shown in FIG. 1 and FIG. 2. FIG. 4 shows the state of a wafer when chips having the structure shown in FIG. 2 are to be obtained from the wafer. FIG. 5 shows the arrangement of the electrodes shown in FIG. 4.

First, a substrate preparation step (S10) shown in FIG. 3 is performed. More specifically, a GaN substrate is first prepared. Then, a film-forming method such as MOCVD (metal organic chemical vapor deposition) is performed on the first main surface of the GaN substrate to form a layered structure (an Si-doped n-type GaN layer/an Si-doped n-type $Al_{0.2}Ga_{0.8}N$ layer serving as a clad layer/an MQW (multi-quantum well) formed by stacking multiple two-layer structures consisting of a GaN layer and an $In_{0.15}Ga_{0.85}N$ layer/an Mg-doped p-type $Al_{0.2}Ga_{0.8}N$ layer serving as a clad layer/an Mg-doped p-type GaN layer). Next, this wafer can be activated to lower the resistance of the Mg-doped p-type layer. Then, photolithography and RIE (reactive ion etching) are performed to etch the wafer from the Mg-doped p-type layer side to the Si-doped n-type layer using a Cl-based gas. Element separation grooves 25 are formed through this etching as shown in FIG. 4, and the elements are separated.

Next, photolithography, vapor deposition, and lift-off are performed on the back N surface, which is the second main surface of the GaN substrate, to form the n-electrodes 11, which have a four-sided shape when seen from above, positioned at the centers of the chips at a predetermined pitch (distance) $L_2$ (see FIG. 4 and FIG. 5). The n-electrodes 11 can be formed as a layered structure consisting of, starting from the bottom layer in contact with the GaN substrate: (a Ti layer/an Al layer/a Ti layer/an Au layer). Then, the GaN substrate is heated in a nitrogen ($N_2$) atmosphere in order to have the contact resistance between the n-electrodes 11 and the back surface of the GaN substrate be a predetermined value.

Next, a conductor layer having a predetermined thickness is formed in contact with the p-type GaN layer to serve as the p-electrode. For example, the conductor layer can be formed by forming an Ni layer with a predetermined thickness in contact with the GaN layer with an Au layer having a predetermined thickness formed over the entire surface thereon (see FIG. 4 and FIG. 5). In this case, the GaN substrate can be heated in an inert gas atmosphere in order to have the contact resistance between the p-electrode and the p-type GaN layer be a predetermined value.

Next, a groove forming step (S20) shown in FIG. 3 is performed. More specifically, dicing is performed on the back surface (N surface) of the GaN substrate in order to form the grooves 80 having a V-shaped cross-section. As shown in FIG. 5, the grooves 80 are formed as multiple vertical grooves 80a and horizontal grooves 80b. The n-electrodes 11 are positioned on the flat surfaces between the grooves 80.

Next, a surface treatment step (S30) shown in FIG. 3 is performed. More specifically, RIE surface treatment is performed to apply a specular finish to the processed surface (N surface) of the GaN substrate on which the grooves are formed. The reactive gas used in the RIE operation can be, for example, chlorine gas (Cl gas). It would be preferable for the thickness of the surface layer removed by RIE from the N surface of the GaN substrate to be at least the average diameter of the abrasive grain of the dicing blade used in the dicing performed in the groove forming step (S20) described above.

Then, as shown in FIG. 4 and FIG. 5, scribing is performed so that chip boundaries 50 emerge as side surface. The resulting chips serve as light-emitting devices. As shown in FIG. 1, a light-emitting device is formed by mounting the chip in the mounting section 21a of the lead frame so that the p-type GaN layer side of the chip is in contact with the mounting section 21a. The conductive adhesive 14 applied to the mounting section secures the light-emitting device and the mount and provides conductivity. Then, after performing wire bonding between the n-electrode 11 and the lead section of the lead frame to provide continuity, an epoxy-based resin 15 is used to seal the structure in resin so that the light-emitting device forms a lamp. It would also be possible, in order to improve heat dissipation from the light-emitting device, to mount the p-type GaN layer of the light-emitting device so that the entire surface thereof is in contact with the mounting section in order to improve heat dissipation from the light-emitting device. Also, the conductive adhesive 14 can be an Ag-based adhesive with good thermal conductivity, and the lead frame can be a CuW-based structure with good conductivity.

Figure 6:
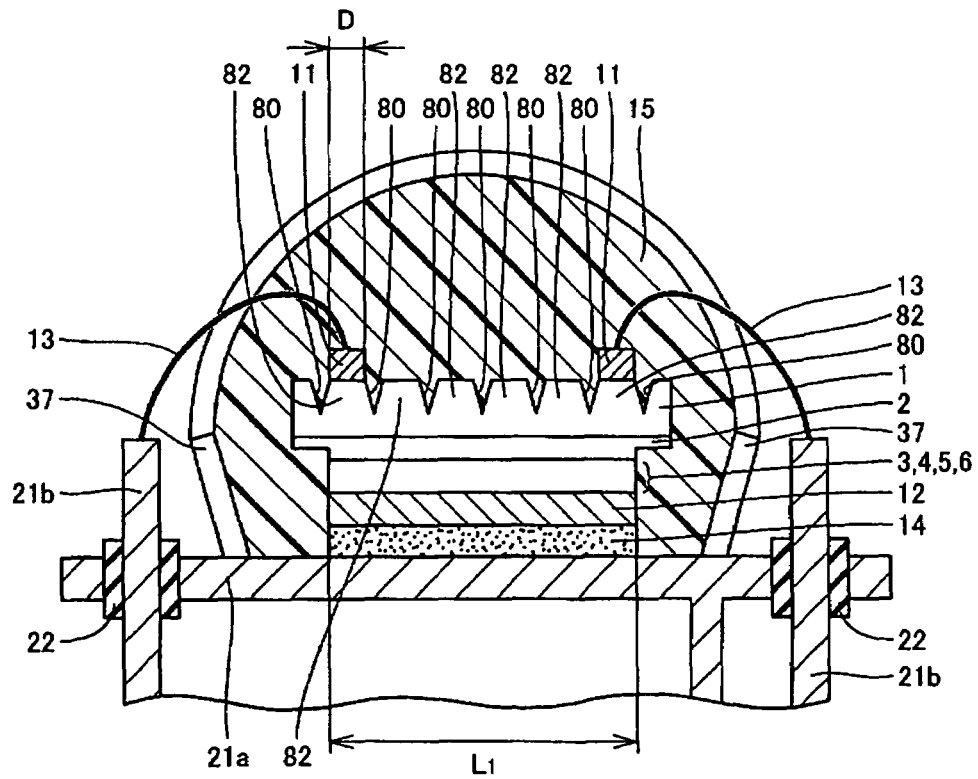
FIG. 6 shows a first alternate example of the first embodiment of the LED according to the present invention shown in FIG. 1 through FIG. 5.
Figure 7:
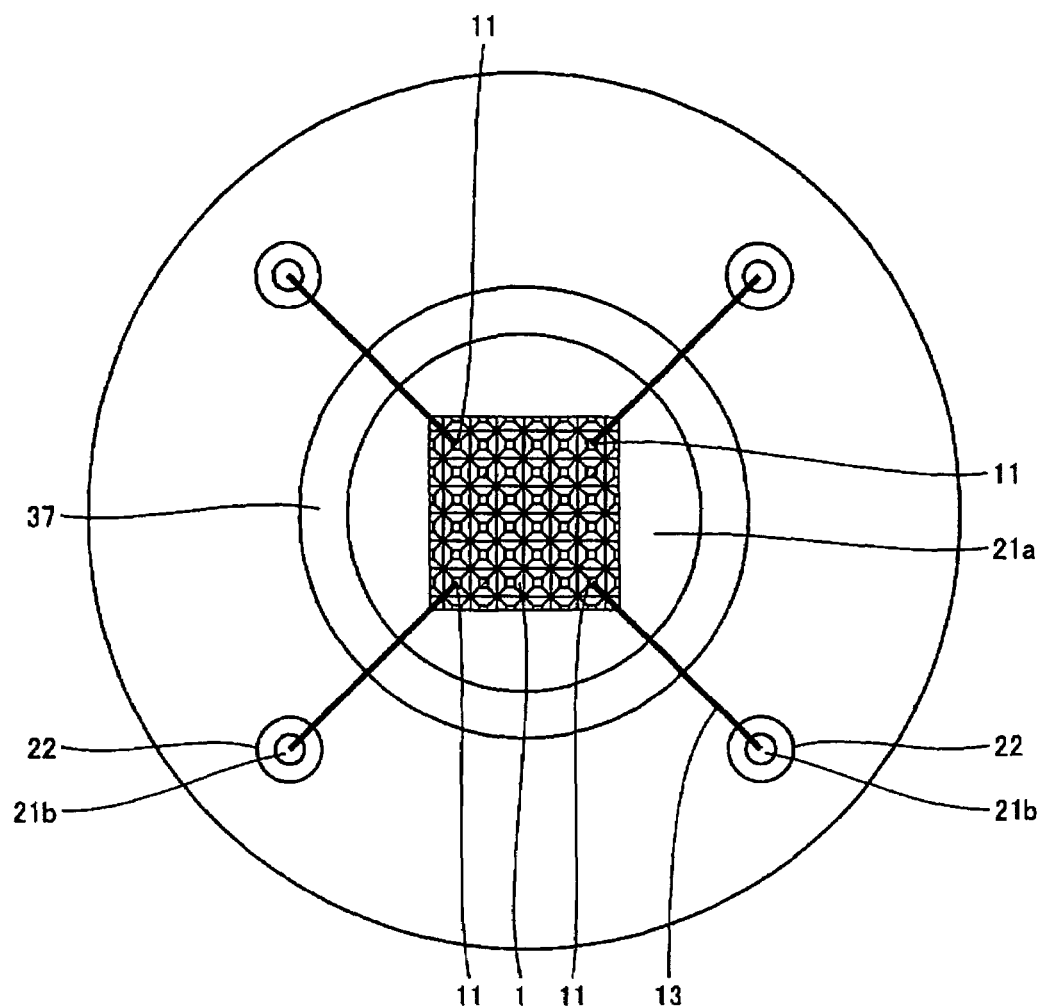
FIG. 7 shows the shape of the LED shown in FIG. 6 when seen from above.

FIG. 6 shows a first alternate example of the first embodiment of an LED according to the present invention shown in FIG. 1 through FIG. 5. FIG. 7 is a plan drawing of the LED shown in FIG. 6. Referring to FIG. 6 and FIG. 7, the first alternate example of the first embodiment of an LED according to the present invention will be described.

The LED shown in FIG. 6 and FIG. 7 has essentially the same structure as the LED shown in FIG. 1 and FIG. 2, except the placement of the n-electrodes 11 near the four corners of the GaN substrate differs from the LED shown in FIG. 1 and FIG. 2. Also, in the LED shown in FIG. 6 and FIG. 7, a reflective cup is disposed on the lead frame to surround the semiconductor chip when the semiconductor chip is mounted.

Figure 8:
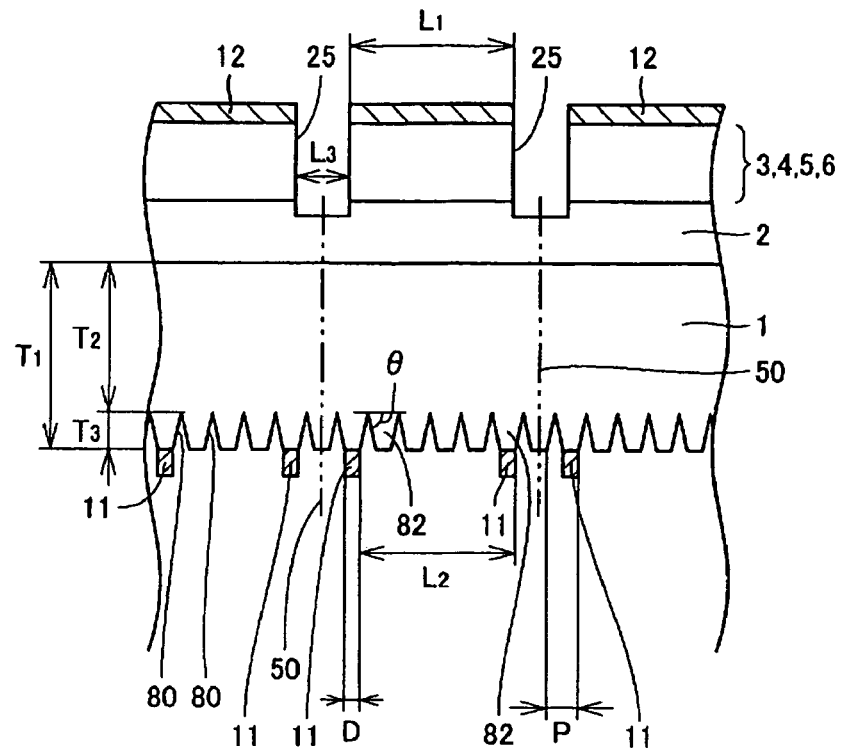
FIG. 8 shows the state of a wafer when chips having the layered structure used in the LED shown in FIG. 6 and FIG. 7 are obtained from the wafer.

The method for making the LED shown in FIG. 6 and FIG. 7 is essentially the same as the method for making the LED shown in FIG. 1 and FIG. 2. However, as shown in FIG. 8, the distance between the adjacent grooves 80 (pitch P) is smaller than the pitch P shown in FIG. 4, and the number of the grooves 80 per chip is greater than that of the LED shown in FIG. 1 and FIG. 2. FIG. 8 shows the state of the wafer when the layered structure used in the LED shown in FIG. 6 and FIG. 7 is obtained from the wafer.

In this case, since the number of the n-electrodes 11 is greater, the area of each n-electrode 11 can be smaller than the area of the n-electrode 11 of the LED shown in FIG. 1 and FIG. 2.

Figure 9:
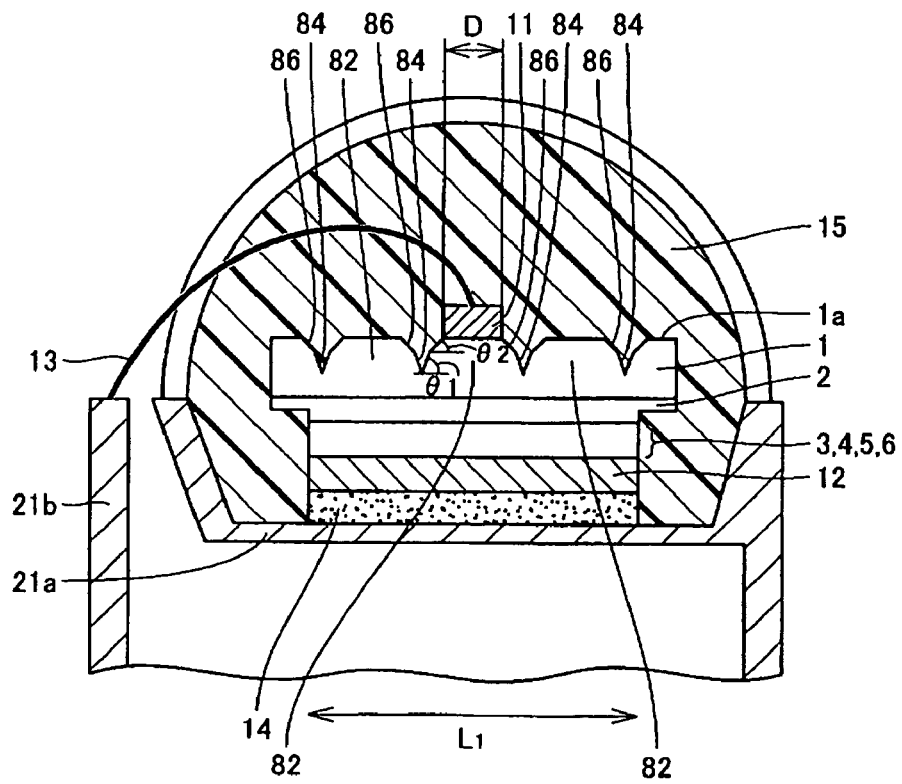
FIG. 9 shows a second alternate example of the first embodiment of the LED according to the present invention shown in FIG. 1 through FIG. 5.

FIG. 9 shows a second alternate example of the first embodiment of an LED according to the present invention shown in FIG. 1 through FIG. 5. Using FIG. 9, the second alternate example of the first embodiment of an LED of the present invention will be described.

The LED shown in FIG. 9 has essentially the same structure as the LED shown in FIG. 1 and FIG. 2, but the shape of the side walls of the grooves 80 formed on the second main surface 1a of the GaN substrate 1 is different. More specifically, the side walls of the groove 80 are formed from a bottom-side side wall 84 positioned at the bottom side and having a relatively large angle θ1 relative to the second main surface 1a, and opening-side side walls 86 continuous with the bottom-side side wall 84 having a relatively small angle θ2 relative to the second main surface 1a. With this structure, the light output exiting from the second main surface 1a can be greater than that of the LED shown in FIG. 1 and FIG. 2.

The method for making the LED shown in FIG. 9 is essentially the same as the method for making the LED shown in FIG. 1 and FIG. 2. However, in the groove forming step (S20) (see FIG. 3) for forming the grooves 80 on the second main surface 1a of the GaN substrate 1, dicing is performed twice. More specifically, the bottom-side side wall 84 is formed during the first dicing operation using a blade where the angle of the blade edge performing the dicing has a relatively small angle. Then, using a blade in which the blade edge has a relatively large angle, a second dicing operation is performed by tracing the sections on which the first dicing operation was performed to form the opening-side side walls 86. The depth to which the blade edge cuts into the second main surface 1a of the GaN substrate 1 is less than the cutting depth used in the first dicing operation. Referring to FIG. 9, this results in the grooves 80 formed from the bottom-side side walls 84 having an angle θ1 relative to a plane parallel to the second main surface and opening-side side walls 86 having an angle θ2 relative to a plane parallel to the second main surface (where θ2<θ1). Stated another way, the side walls of the grooves 80 are formed in two stages with different angles (the bottom-side side walls 84 and the opening-side side walls 86). Also, it would be possible to reverse the sequence of the first dicing operation and the second dicing operation described above.

Figure 10:
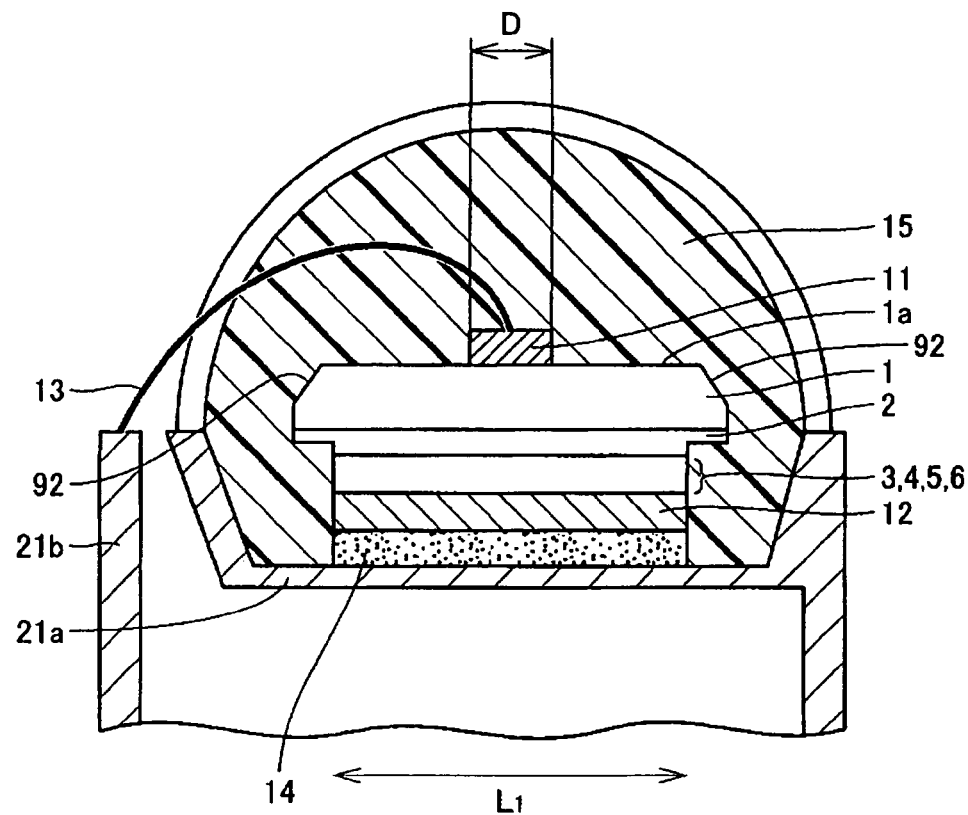
FIG. 10 shows a third alternate example of the first embodiment of the LED according to the present invention shown in FIG. 1 through FIG. 5.

FIG. 10 shows a third alternate example of the first embodiment of an LED according to the present invention shown in FIG. 1 through FIG. 5. Using FIG. 10, the third alternate example of the first embodiment of the LED according to the present invention will be described.

The LED shown in FIG. 10 has essentially the same structure as the LED shown in FIG. 1 and FIG. 2, except that the arrangement of the grooves formed on the second main surface 1a of the GaN substrate 1 is different. More specifically, in the GaN substrate 1, the grooves are formed on the GaN substrate 1 along the sections that will form the outer perimeter sections of the chip, and the chip is obtained from the wafer along these grooves. As a result, sloped surfaces 92 are formed at the outer perimeter section of the chip from one of the side walls of the grooves. With this structure, the light exit surface releasing light perpendicular to the second main surface 1a can be made larger compared to a structure in which grooves and sloped side surfaces (sloped surfaces) are not formed on the second main surface 1a of the GaN substrate 1. Thus, the light output emitted perpendicular to the second main surface 1a can be increased compared to the conventional technology.

The method for making the LED shown in FIG. 10 is essentially the same as the method for making the LED shown in FIG. 1 and FIG. 2. However, in the groove forming step (S20) (see FIG. 3) for forming the grooves 80 on the second main surface 1a of the GaN substrate 1, dicing is performed along the chip boundaries 50 (see FIG. 4). Then, after the surface treatment step (S30), the chips resulting from the scribing operation form the light-emitting device shown in FIG. 10. After the chips are formed through scribing in this manner, the side walls of the grooves formed along the chip boundaries 50 form the sloped surfaces 92 along the outer perimeter sections of the chips.

SECOND EMBODIMENT

Figure 11:
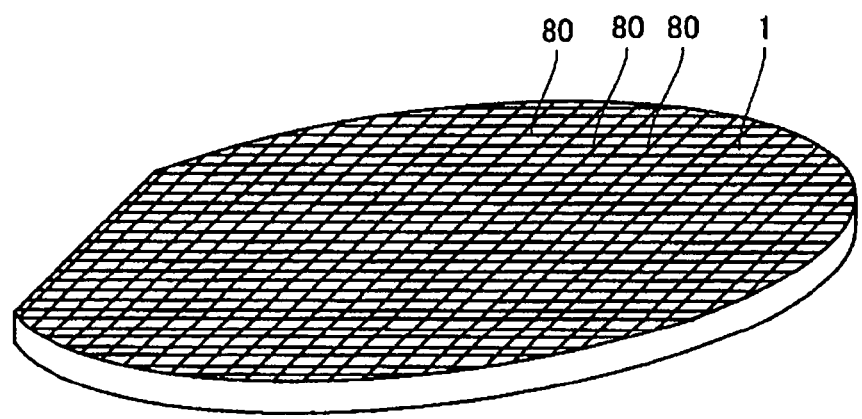
FIG. 11 is a simplified drawing showing a second embodiment of a GaN substrate according to the present invention including multiple regions that will form chips used in a light-emitting device according to the present invention.

In the first embodiment described above, chips formed by scribing the GaN substrate 1 are mounted into lead frames to form light-emitting devices. However, in some cases, handling may be made easier by not splitting the GaN substrate 1 into chips used in light-emitting devices, e.g., by handling as a single substrate as shown in FIG. 11 in which the grooves 80 have been formed on the GaN substrate 1 and the surface treatment step (S30) (see FIG. 3) has been performed. FIG. 11 is a simplified drawing showing a second embodiment of a GaN substrate according to the present invention containing multiple regions that will form chips used in light-emitting devices according to the present invention. As shown in FIG. 11, multiple grooves 80 are formed on the second main surface 1a, which is one of the main surfaces of the GaN substrate 1. Also, surface treatment is performed on the second main surface. As a result, the inner perimeter surfaces of the grooves 80 have been smoothed due to the removal of a predetermined thickness of the surface layer thereof by the surface treatment operation, e.g., RIE. By handling these multiple chips in the form of the GaN substrate 1 before it is split up, these multiple chips become easier to handle.

FIRST EXAMPLE

In order to study the advantages of the light-emitting device of the present invention, the samples described below were prepared and blue light output values were measured when a predetermined current was applied. First, the prepared samples will be described.

(First invention sample): The LED according to a first invention sample is equipped essentially with the same structure as the LED shown in FIG. 1 and FIG. 2. The method for making the LED of the first invention sample is also essentially the same as the method for making the light-emitting device described with reference to FIG. 3 through FIG. 5. This will be described in more detail below.

(S1-1): A GaN off-substrate with a 0.5 deg offset from the c-plane was used. The oxygen concentration of the substrate was $5E18/cm^3$, the dislocation density was $1E7/cm^2$, and the thickness was 400 microns.

(S1-2): The following layered structure was formed on the Ga surface, which is the first main surface of the GaN substrate, using MOCVD (metal organic vapor deposition): (an Si-doped n-type GaN layer/an Si-doped n-type $Al_{0.2}Ga_{0.8}N$ layer serving as a clad layer/an MQW (multi-quantum well) formed by stacking three two-layer structures consisting of a GaN layer and an $In_{0.15}Ga_{0.85}N$ layer/an Mg-doped p-type $Al_{0.2}Ga_{0.8}N$ layer serving as a clad layer/an Mg-doped p-type GaN layer)

(S1-3): The emitted light wavelength was 450 nm.

(S1-4): This wafer was activated to lower the resistance of the Mg-doped p-type layer. The carrier concentration based on Hall measurements was $5E17/cm^3$ for the Mg-doped p-type $Al_{0.2}Ga_{0.8}N$ layer, and $1E18/cm^3$ for the Mg-doped p-type GaN layer.

(S1-5): Using photolithography and RIE (reactive ion etching), this wafer was further etched from the Mg-doped p-type layer side to the Si-doped n-type layer using a Cl-based gas. This etching formed the element separation grooves 25 as shown in FIG. 4, and the elements were separated. The width L3 of the element separation grooves was 100 microns.

(S1-6): Photolithography, vapor deposition, and lift-off were performed on the N surface at the back surface, which is the second main surface of the GaN substrate, to form n-electrodes (see FIG. 4 and FIG. 5) at a pitch as shown in FIG. 4 of distance L2=2 mm at the centers of the chips with a square shape when seen from above with the sides having a width of length D of 200 microns (200 microns□). For the n-electrode, a layered structure was formed as follows, starting from the bottom layer in contact with the GaN substrate 1: (a 20 nm Ti layer/a 100 nm Al layer/a 20 nm Ti layer/a 200 nm Au layer). This was heated in a nitrogen ($N_2$) atmosphere, resulting in a contact resistance of at least $1E\text{-}5\Omega \cdot cm^2$.

(S1-7): For the p-electrode, an Ni layer was formed in contact with the p-type GaN layer with a thickness of 4 nm, and an Au layer with a thickness of 4 nm was formed over the entire surface thereon (see FIG. 4 and FIG. 5). This was heated in an inert gas atmosphere to set the contact resistance to $5E\text{-}4\Omega \cdot cm^2$.

Figure 12:
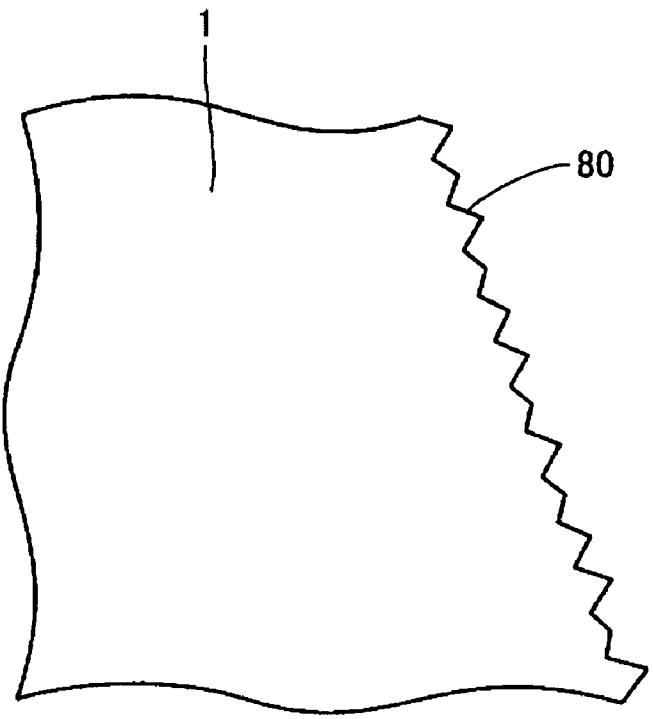
FIG. 12 is a simplified cross-section drawing illustrating the surface state of the inner perimeter surface of grooves formed by dicing.

(S1-8): Then, dicing was performed to form the grooves 80 with V-shaped cross-sections on the N surface of the substrate. Referring to FIG. 4, the groove depth $T_3$ was set to 200 microns, the angle θ formed between the side walls of the grooves 80 and a plane parallel to the second main surface of the GaN substrate 1 was set to 60 deg, and the pitch P between adjacent grooves 80 was set to 500 microns. Also, for the dicing operation, a dicing blade with an average abrasive grain diameter of 10 microns was used. As a result, indentations and projections having a height corresponding to the average abrasive grain diameter of the dicing blade were formed on the inner perimeter surface (side wall surface) of the grooves 80 formed by the dicing operation, as shown in FIG. 12. FIG. 12 is a simplified cross-section drawing illustrating the state of the surface of the inner perimeter surface of the grooves formed by the dicing operation.

Figure 13:
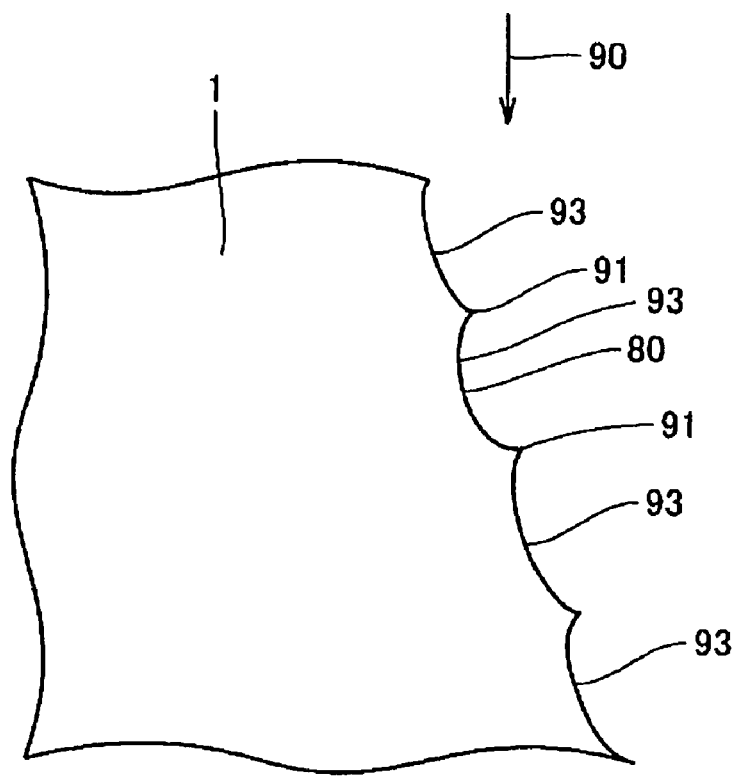
FIG. 13 is a simplified cross-section drawing showing the state of the inner perimeter surfaces of grooves after a specular finish is applied using RIE.
Figure 14:
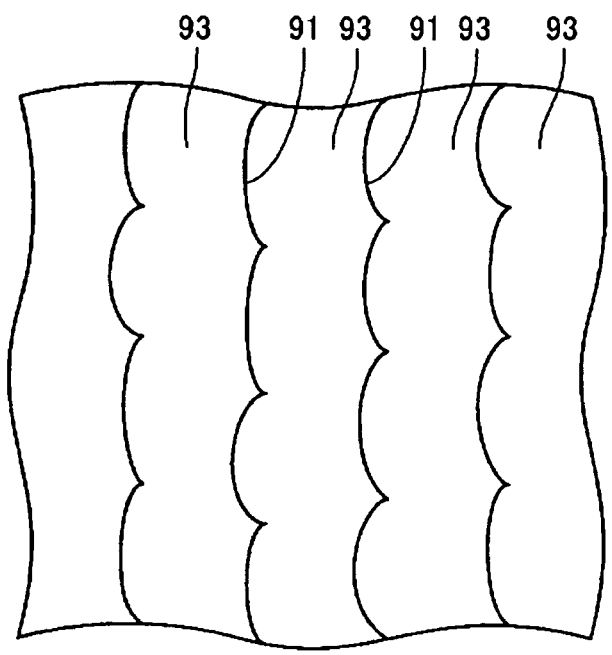
FIG. 14 is a simplified drawing showing the state of the inner perimeter surfaces of grooves when seen from the direction of the arrow 90 shown in FIG. 13.

(S1-9): Then, a specular finish was applied using RIE to the processed surface (N surface) of the GaN substrate 1 on which the grooves 80 were formed. More specifically, the GaN substrate 1 was mounted in a processing container of an RIE device so that the N surface faced upward. Then, RIE processing was performed with the following processing conditions: the pressure in the processing container was set to 20 mTorr; the applied power was 100 W; the reaction gas was 100% chlorine ($Cl_2$) gas; the flow of the reaction gas, i.e., the chlorine gas, was 50 sccm (standard cc/min) (i.e., 0.05 liters/min); and the processing time was 160 minutes. Since the etching rate of the N surface of the GaN substrate 1 was 70 nm/min, the thickness of the surface layer of the N surface removed by this surface treatment (RIE processing) was approximately 11 microns. As a result, as shown in FIG. 13 and FIG. 14, the inner perimeter surfaces (side wall surfaces) of the grooves 80 were made smooth by the removal of this thickness from the surface layer. FIG. 13 is a simplified cross-section drawing showing the state of the inner perimeter surfaces of the grooves after a specular finish was applied using RIE. FIG. 14 is a simplified drawing showing a state of the inner perimeter surface of the groove as seen from the direction of arrow 90 in FIG. 13. As can be seen from FIG. 13 and FIG. 14, the inner perimeter surface of the grooves 80 after specular finishing is formed with relatively flat curved surface sections 93 connected to each other. The curved surface sections 93 extend along the direction that the grooves 80 extend (in the direction that a line following the vertex position at the base of the grooves 80 extends). Thus, boundary lines 91 at the boundaries between adjacent curved surface sections 93 also extend in the direction that the grooves 80 extend. As can be seen from FIG. 12 through FIG. 14, the inner perimeter surfaces of the grooves 80 are made smooth by the specular finishing performed using RIE.

(S1-10): Then, as shown in FIG. 4 and FIG. 5, scribing was performed so that the chip boundaries 50 form side surfaces, and the resulting chips were used to form light-emitting devices. The light-emitting device chips were formed with a light release surface that was 1.9 mm□ (a square with 1.9 mm sides), and the light-emitting layer was 1.9 mm□. More specifically, the length L1 of a p-electrode side was 1.9 mm, and the scribe line pitch (length of a chip side) was L2=2 mm. Also, the element separation groove width L3=100 microns, and the width D of each side of the n-electrode was 200 microns (the n-electrode was 200 microns□).

(S1-11): As shown in FIG. 1, this chip was mounted so that the p-type GaN layer side of the chip comes into contact with the mounting section 21a of the lead frame to form the light-emitting device. The light-emitting device and the mount were secured using the conductive adhesive 14 applied to the mounting section, thus providing continuity.

(S1-12): In order to improve heat dissipation from the light-emitting device, mounting is performed so that the entire surface of the p-type GaN layer of the light-emitting device was in contact with the mounting section. Also, an Ag-based adhesive, which has good thermal conductivity, was used, and a CuW-based lead-frame, which has good thermal conductivity, was used. As a result, the obtained heat resistance was 8 deg C/W.

(S1-13): Furthermore, a wire bond was used between the n-electrode and the lead section of the lead frame to provide continuity, and a lamp was formed from the light-emitting device by sealing the structure in resin using an epoxy-based resin.

(First Comparative Sample)

An LED according to a first comparative sample was equipped with essentially the same structure as the LED of the first invention sample described above, but differed from the LED of the first invention sample in that the N surface of the GaN substrate 1 was not smoothed. Thus, in the LED of the first comparative sample, the indentations and projections formed by dicing (indentations and projections with sizes proportional to the size of the abrasive grain of the dicing blade) are formed on the inner perimeter surfaces of the grooves 80.

The method for making the LED of the first comparative sample was as follows.

(S2-1)-(S2-8): Essentially the same as (S1-1)-(S1-8) of the first invention sample.

(S2-9)-(S2-12): Essentially the same as (S1-10)-(S1-13) of the first invention sample.

In other words, the method for making the LED of the first comparative sample was essentially the same as the method for making the first invention sample except that the step (S1-9) of the first invention sample (surface treatment involving applying a specular finish using RIE) was not performed.

(Second Comparative Sample)

Figure 15:
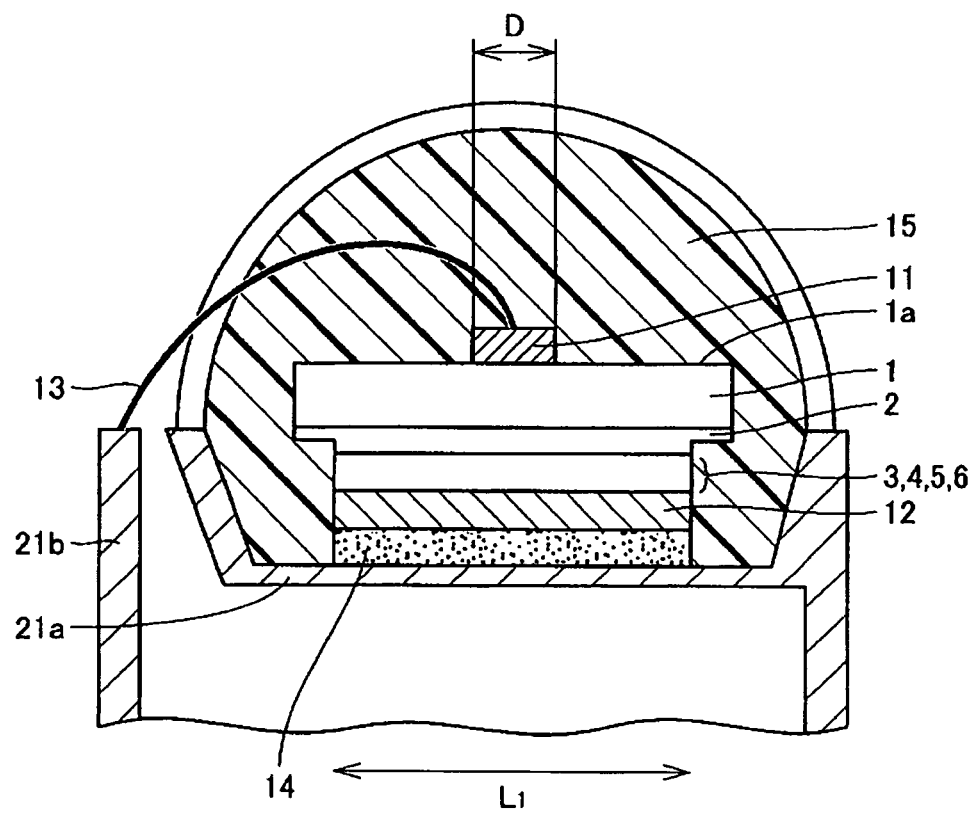
FIG. 15 is a simplified drawing showing an LED according to a second comparative example.

An LED according to a second comparative sample was equipped with essentially the same structure as the LED of the first comparative sample except that no grooves are formed on the N surface of the GaN substrate 1 as shown in FIG. 12. FIG. 15 is a simplified drawing showing the LED of the second comparative sample.

The method for making the LED of the second comparative sample is as follows.

(S3-1)-(S3-7): Essentially the same as (S1-1)-(S1-7) of the first invention sample.

(S3-8)-(S3-11): Essentially the same as (S1-10)-(S1-13) of the first invention sample.

(Tests and Results)

The first invention sample and the first and second comparative samples were each placed in an integrating sphere, a predetermined current (1 A) was applied, the light was focused, and the light output values from detectors were compared. As a result, an output of 0.5 W was obtained for the first invention sample. The output for the first comparative sample was 0.42 W, and the output for the second comparative sample was 0.4 W. Thus, in the first invention sample in which the grooves 80 are formed on the light exit surface side (the second main surface side) of the GaN substrate and the inner perimeter surfaces of the grooves 80 were made smooth by performing surface treatment, a greater light output was obtained from the first invention sample compared to the first and second comparative samples due to factors such as: the relatively large contact boundary surface area between the GaN substrate 1 and the epoxy-based resin 15; the prevention of total internal reflection at the boundary surface due to the multiple angles formed by the boundary surface relative to the light-emitting layer surface; and the ability to limit light loss compared to the comparative samples at the boundary surface due to the smoothing of the boundary surface.

SECOND EXAMPLE

Next, in the first invention sample described above, the effect on the light transmittivity of the GaN substrate 1 of the surface treatment performed after formation of the grooves 80 was studies.

First, three flat GaN substrates were prepared with the same thickness and transmittivity as was used in the making of the first invention sample. Of the three GaN substrates, the entire N surface of two substrates were abraded with abrasives having an average grain diameter of 10 microns. Then, RIE was performed under the same conditions as the step (S1-9) of the first invention sample on the N surface of one of the two abraded GaN substrates. The surface state of the N surface of the GaN substrate that has undergone only abrading approximates the surface state of the grooves 80 formed in the step (S1-8) of the first invention sample immediately after the dicing operation. Also, the surface state of the N surface of the GaN substrate on which RIE processing was performed after abrasion approximates the state of the inner perimeter surfaces of the grooves 80 after step (S1-9) of the first invention sample was performed (after the smoothing operation).

Then, transmittivity was measured using a spectrophotometer for the three GaN substrates described above. In this transmittivity measurement, transmittivity along the thickness axis of the GaN substrate was measured for light having a wavelength of 450 nm. As a result, when the transmittivity of a GaN substrate which has not undergone abrasion or RIE is set to 100 percent, the GaN substrate that has undergone only abrasion has a transmittivity of 40 percent, and the GaN substrate that has undergone both abrasion and RIE processing has a transmittivity of 80 percent. Thus, it can be seen that for the sections that have been abraded with abrasives having an average grain diameter of 10 microns (processing-damage layers or regions with crystal face damage), the transmittivity of light with 450 nm wavelength was 40 percent that of the pre-abraded state. While the pre-abraded state (100 percent) is not restored completely by performing RIE, the transmittivity can be restored to 80 percent of the pre-abraded state. The surface of the GaN substrate that has undergone RIE had a surface roughness with an Ra of 0.3 nm.

THIRD EXAMPLE

In a third example of the present invention, the relationship between the oxygen concentration and the specific resistance of a GaN substrate with light transmittivity was studied. Based on this relationship, it is possible to establish the optimal relationship between GaN substrate thickness and oxygen concentration for a predetermined light release area in a p-down mounted light-emitting element, i.e., a light-emitting element in which the GaN substrate is the light release surface. As described above, since the GaN substrate is the light release surface in a p-down mounted structure, oxygen concentration, which has a significant effect on specific resistance and light transmittivity, is especially important.

Figure 16:
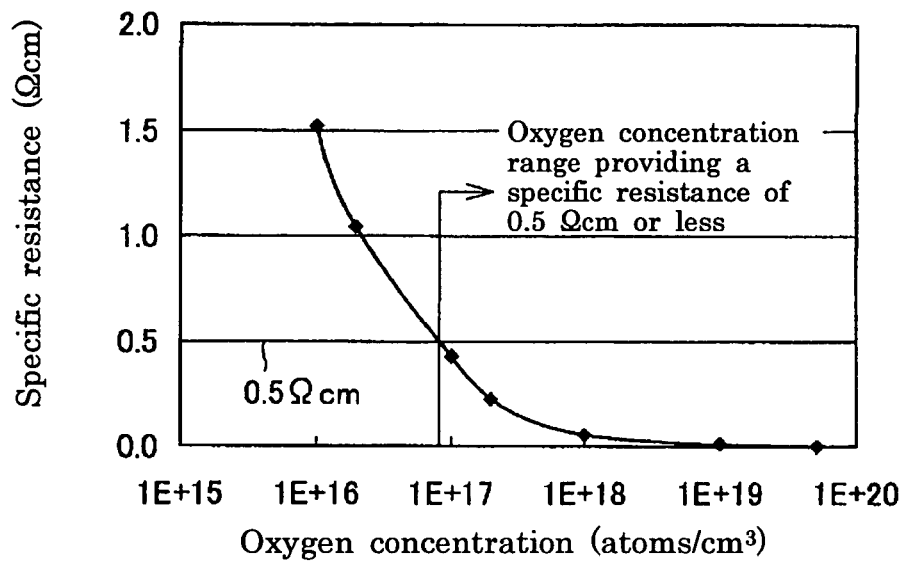
FIG. 16 illustrates the effect of oxygen concentration on the specific resistance of a GaN substrate.
Figure 17:
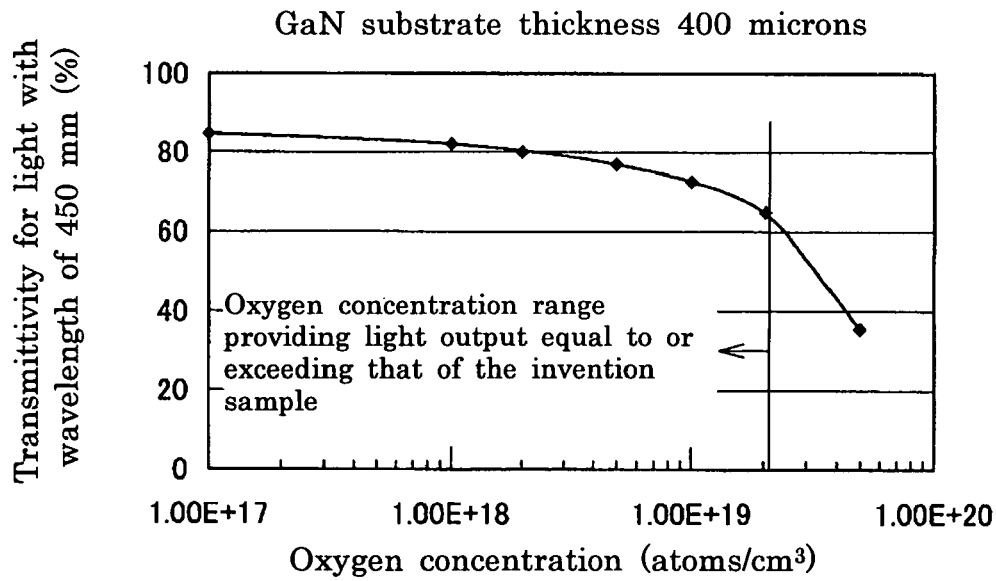
FIG. 17 shows the effect of oxygen concentration on the transmittivity of a 400 micron GaN substrate for light having a wavelength of 450 nm.

FIG. 16 shows the effect of oxygen concentration on the specific resistance of the GaN substrate. Referring to FIG. 16, a specific resistance of no more than 0.5 Ωcm can be achieved with an oxygen concentration of at least $1E17/cm^3$. Also, FIG. 17 shows the effect of oxygen concentration on transmittivity for light with a wavelength of 450 nm with a GaN substrate of 400 microns. Referring to the figure, when the oxygen concentration exceeds $2E19/cm^3$, the transmittivity of light having a wavelength of 450 nm drops dramatically. FIG. 16 and FIG. 17 show that increasing oxygen concentration is effective in reducing the specific resistance of the GaN substrate and expanding the light-emission surface but also reduces light transmittivity. Thus, in a GaN substrate used in a p-down mounted light-emitting element, the oxygen concentration, the thickness of the GaN substrate, and the light-emission plan size are extremely important.

Figure 18:
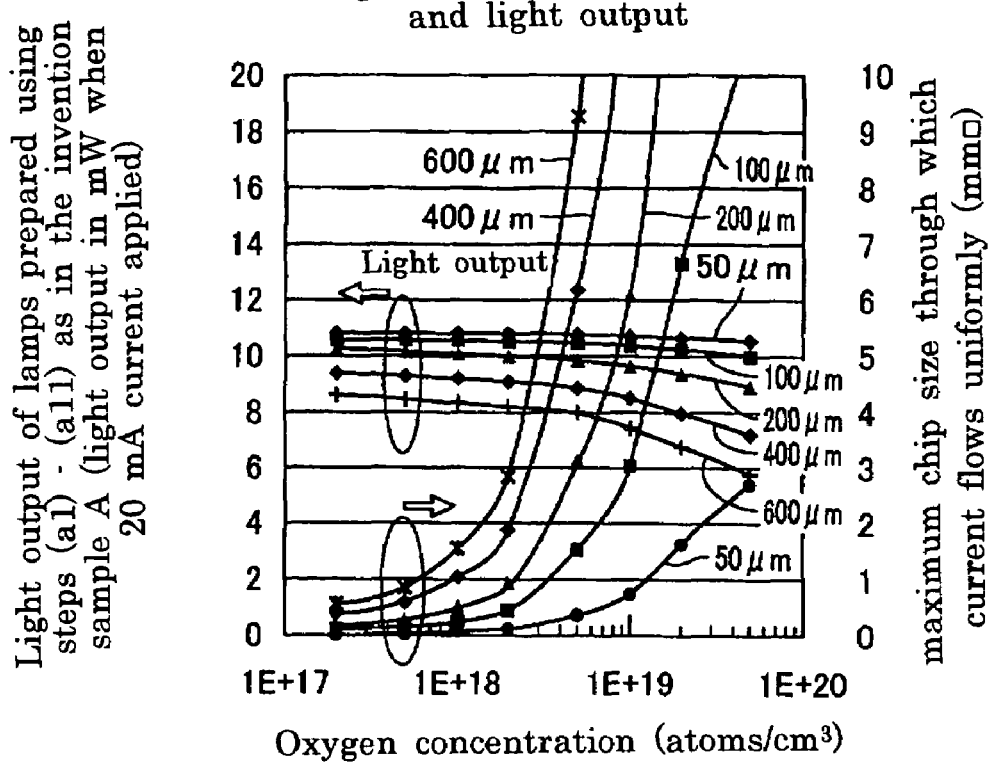
FIG. 18 shows the results of measuring light output and plan size through which current flows uniformly when lamps are formed from GaN substrates with varying thicknesses and oxygen concentrations for the LED according to the present invention shown in FIG. 1.

FIG. 18 shows the results of measuring the light output of lamps and the plan sizes through which current flows uniformly when lamps are made for an LED according to the present invention shown in FIG. 1 from GaN substrates with varying thicknesses and oxygen concentrations. The LEDs were made using essentially the same processing steps as in the first invention sample.

Referring to FIG. 18, in terms of lamp light output, greater thicknesses and higher oxygen concentrations tend to reduce light output. Also, in terms of the maximum plan size through which current flows uniformly, greater thicknesses and higher oxygen concentrations tend to increase the size.

Referring to FIG. 18, when the plan size through which current flows uniformly is a square with 4 mm sides (5 mm sides) and a light release surface is 300 microns□ (a square with 300 micron sides), in order to obtain an output corresponding to 8 mW for 20 mA with an LED according to the present invention with a light-emitting layer that is 300 microns□, an oxygen concentration of at least $6E18/cm^3$ (at least $8E18/cm^3$ for a square with 5 mm sides) can be used for a GaN substrate with a thickness of 200 microns. More specifically, a current density in which 20 mA is applied to a square with 300 micron sides in an LED according to the present invention corresponds to the application of 3.6 A (5.6 A) to a square with 4 mm sides (5 mm sides), and uniform light output proportional to the applied current can be obtained while providing light output of at least 1.4 W (2.3 W) when 3.6 A (5.6 A) is applied.

Also, with a GaN substrate having a thickness of 400 microns, specifications identical to the example above with a thickness of 200 microns can be obtained with an oxygen concentration of at least $3E18/cm^3$ for a square with 4 mm sides (an oxygen concentration of $4E18/cm^3$ for a square with 5 mm sides). However, at a thickness of 400 microns, the oxygen concentration must be no more than $2E19/cm^3$ in order to obtain light output corresponding to 8 mW when 20 mA is applied to an LED having a size according to the present invention.

Furthermore, with a GaN substrate having a thickness of 600 microns, the oxygen concentration must be at least $2.5E18/cm^3$ to have current flow uniformly through a square with 4 mm sides. Meanwhile, for a light output corresponding to at least 8 mW for 20 mA applied to an LED having a size according to the present invention as described above, the limit value for the oxygen concentration is only slightly greater than $2.5E18/cm^3$. Thus, these two conditions are met in a narrow oxygen concentration range. Since, for uniform current flow through a square with 3 mm sides, the oxygen concentration is at least approximately $2E18/cm^3$, the oxygen concentration tolerance range is slightly broader than that for a square with 4 mm sides.

Based on FIG. 18, it can be seen that the thickness of the GaN substrate is 200 microns-400 microns, there is an oxygen concentration range that is adequately broad for obtaining an output corresponding to 8 mW when 20 mA is applied to an LED having a size according to the present invention. With a thickness of 200 microns, this is possible with an oxygen concentration having a lower limit that is lower than $2E19/cm^3$. Also, with a thickness of 400 microns, this is possible with an oxygen concentration of at least $8E18/cm^3$.

Next, examples of the present invention will be summarized below, although there may be some overlap with the above examples.

A light-emitting device according to the present invention is a light-emitting device including: a nitride semiconductor substrate (the GaN substrate 1); an n-type nitride semiconductor layer (the $Al_xGa_{1-x}N$ layer 3) on the first main surface side of the nitride semiconductor substrate; a p-type nitride semiconductor layer (the p-type $Al_xGa_{1-x}N$ layer 5) positioned further from the nitride semiconductor substrate compared to the n-type nitride semiconductor layer; and a light-emitting layer (the multi-quantum well (MQW) 4) positioned between the n-type nitride semiconductor layer and the p-type nitride semiconductor layer. The p-type nitride semiconductor layer side is down-mounted. Also, light is released from the second main surface 1a, which is the main surface opposite from the first main surface of the nitride semiconductor substrate. The grooves 80 are formed on the second main surface of the nitride semiconductor substrate. The grooves 80 include sections (the curved surface sections 93) on which surface treatment has been performed in order to smooth the inner perimeter surface.

Since the grooves 80 are formed on second main surface 1a, which is the light exit surface of the nitride semiconductor substrate, light can be extracted from the side walls of the grooves 80 as well. As a result, the light usage efficiency of the light-emitting device can be improved.

Furthermore, since the grooves formed on the second main surface 1a, which is the light exit surface, include the curved surface sections 93, which are sections on which surface treatment has been performed in order to smooth the inner perimeter surface of the grooves, even if processing-damage layers or region with crystal face damages are formed on the second main surface 1a when the grooves 80 are formed, the surface treatment operations described above can improve or remove processing-damage layers and regions with crystal face damage. (For example, if the surface treatment involves removing a certain amount of thickness from the surface layer of the second main surface 1a including the inner perimeter surfaces of the grooves, this can remove processing-damage layers and regions with crystal face damage.) As a result, it is possible to prevent reduction in light extraction efficiency from the second main surface 1a due to processing-damage layers and the like.

Also, in the structure described above, since the n-type electrode 11 is disposed on the back surface (the second main surface) of the nitride semiconductor substrate (the GaN substrate 1), which has a low electrical resistance, it is possible to have the current flow through the entire nitride semiconductor substrate even if the n-electrode 11 is disposed with a small covering ratio, i.e., a large opening ratio. As a result, the proportion of light absorbed at the release surface is reduced, increasing the light emission efficiency. Of course, light release can take place not only from the second main surface but also from the side surfaces. This is true for the light-emitting devices described below as well.

Since the p-type nitride semiconductor layer side, which has a higher electrical resistance, is not the light release surface, the p-type electrode layer (the p-electrode 12) can be formed over the entire surface of the p-type nitride semiconductor layer, thus making it possible to provide a structure that is suited for limiting heat generation at high currents as well as for allowing the generated heat to escape through conduction. In other words, design restrictions imposed by thermal factors are considerably relaxed. As a result, there is no need to have the p-electrode and the n-electrode formed as interleaved comb-shaped structures to reduce the electrical resistance.

Furthermore, because the GaN substrate 1 has superior conductivity, extremely good high-voltage resistance can be provided without the need for using protective circuitry for surge voltages. Also, since there is no need to perform complex processing steps, production costs can be easily reduced.

In this light-emitting device, the depth of the grooves 80 can be at least 50 microns and no more than 300 microns. The thickness along the thickness axis of the nitride semiconductor substrate at the sections where the grooves 80 are not formed can be at least 100 microns and no more than 600 microns.

In this case, since the side walls of the grooves 80 serving as the light exit surface can have sufficient area, light can be adequately extracted from the second main surface 1a. If the depth of the grooves 80 is less than 50 microns, it becomes difficult to increase the amount of extracted light by increasing the area of the light exit surface. Also, a certain degree of thickness is needed in the nitride semiconductor substrate at the bottom sections of the grooves 80 in order to allow a current supplied to the substrate to achieve adequate coverage for the light-emitting layer. Thus, if the thickness of the grooves 80 exceeds 300 microns, the substrate becomes too thick at the sections where the grooves 80 are not formed. This results in reduced light transmittivity at the sections where the grooves 80 are not formed and ultimately makes increasing the amount of light exiting from the second main surface 1a difficult.

Also, it would be possible to have the thickness of the nitride semiconductor substrate at the sections formed with the grooves 80 (the thickness of the nitride semiconductor substrate at the base of the grooves 80) to be at least 50 microns and no more than 300 microns. This allows the current to be supplied to the light-emitting layer 4 with adequate coverage through the substrate even when the grooves 80 are formed, thus making it possible to provide adequate light output. If the thickness of the nitride semiconductor substrate at the sections where the grooves 80 are not formed is less than 100 microns (if the thickness of the nitride semiconductor substrate at the bases of the grooves 80 is less than 50 microns), the substrate becomes too thin so that the current that is supplied to the substrate is supplied to the light-emitting layer 4 with inadequate coverage. As a result, adequate light output cannot be obtained. If the thickness of the nitride semiconductor substrate at the sections where the grooves 80 are not formed exceeds 600 microns (the thickness of the nitride semiconductor substrate at the bases of the grooves 80 exceeds 300 microns), there is not much improvement in the coverage achieved by the supplied current while the increased thickness for the substrate results in excessive material costs for the substrate. Also, if the substrate is too thick, the light transmittivity at the substrate is reduced, making it difficult to increase the amount of light exiting from the second main surface 1a.

In this light-emitting device, it would be possible to form the grooves 80 through dicing using a dicing blade. The sections on which surface treatment is performed (the curved surface sections 93) can be sections obtained by removing a surface layer of the inner perimeter surface of the groove. The thickness of the removed surface layer can be greater than the average diameter of the abrasive grains of the dicing blade.

In this case, since the grooves 80 are formed by dicing, the grooves 80 can be formed more efficiently compared to the use of etching to form the grooves 80. Then, when the grooves 80 are formed by dicing in this manner, the inner perimeter surfaces of the grooves, e.g., the side wall surfaces, are formed with indentations and projections that are approximately the same size as the diameter of the abrasive grains contained in the dicing blade as shown in FIG. 12. As a result, as shown in FIG. 13 and FIG. 14, the indentations and projections shown in FIG. 12 at the inner perimeter surfaces of the grooves 80 can be removed by making the surface layer thickness removed by the surface treatment operation greater than the average diameter of the abrasive grains contained in the dicing blade. As a result, the inner perimeter surfaces of the grooves 80 can be made smooth in an efficient manner. Thus, since the problem of a reduced amount of light exiting by way of the inner perimeter surfaces of the grooves 80 due to the presence of these indentations and projections can be limited, the light extraction efficiency of the light-emitting device can be improved.

For example, it would be possible for the average diameter of the abrasive grains contained in the dicing blade to be at least 0.5 microns and no more than 20 microns. For larger abrasive grain diameters, the size of the indentations and projections formed on the inner perimeter surfaces of the grooves 80 increases, leading to an increase in the thickness of the layer to be removed in the surface treatment operation. As a result, the time required for surface treatment (processing time) increases in increased production costs in the light-emitting device. On the other hand, if the abrasive grain diameter is too small, forming the grooves 80 becomes difficult. More specifically, problems can take place, such as the cracking of the nitride semiconductor substrate (the GaN substrate 1) during the dicing operation for forming the grooves 80 or the need to make an extreme reduction in the feed rate of the dicing blade. Thus, it would be preferable to use an abrasive grain diameter in the above range in order to provide a certain degree of processing speed in the operation for forming the grooves 80 while also reducing the processing speed for the surface treatment to a fixed level, thus reducing the overall production costs for the light-emitting device.

In the light-emitting device described above, the grooves 80 can have a V-shaped cross-section as shown in FIG. 1. In this case, sloped side walls for the grooves 80 can be formed on the second main surface 1a of the nitride semiconductor substrate. Thus, compared to side walls that are perpendicular to the second main surface 1a, the light extracted from the side walls can exit efficiently in the direction of the normal to the second main surface 1a (perpendicular to the second main surface). As a result, light usage efficiency can be improved.

A light-emitting device according to the present invention is a light-emitting device equipped with, as shown in FIG. 10: a nitride semiconductor substrate (the GaN substrate 1); an n-type nitride semiconductor layer (the n-type $Al_xGa_{1-x}N$ layer 3) on the first main surface side of the nitride semiconductor substrate; a p-type nitride semiconductor layer (the p-type $Al_xGa_{1-x}N$ layer 5) positioned further from the nitride semiconductor substrate than the n-type nitride semiconductor layer; and a light-emitting layer (the multi-quantum well (MQW) 4) positioned between the n-type nitride semiconductor layer and the p-type nitride semiconductor layer. The p-type nitride semiconductor layer side is down-mounted and light is released from the second main surface 1a, which is the main surface opposite from the first main surface of the nitride semiconductor substrate. The side surfaces of the nitride semiconductor substrate include the sloped surfaces 92 sloped relative to the second main surface. The sloped surfaces 92 include sections (the curved surface sections 93 shown in FIG. 13 and FIG. 14) on which surface treatment has been performed in order to make the sloped surfaces 92 smooth.

With this structure, since the sloped surfaces 92 are formed on the second main surface 1a, which is the light exiting surface of the nitride semiconductor substrate, light can also be extracted from the sloped surfaces 92 in the direction perpendicular to the second main surface. As a result, the light usage efficiency of the light-emitting device can be improved.

Furthermore, since the sloped surfaces 92 include sections (the curved surface sections 93) on which surface treatment has been performed in order to make the sloped surfaces smooth, even if processing-damage layers or regions with crystal face damage are formed on the sloped surfaces, the surface treatment operation can improve or remove the processing-damage layers or regions with crystal face damage. As a result, it is possible to prevent reduction of light extraction efficiency from the sloped surfaces 92 due to processing-damage layers and the like.

In the light-emitting device described above, the nitride semiconductor substrate can be formed from either GaN or $Al_xGa_{1-x}N$ (0<x<=1). If the GaN substrate 1 is used as the nitride semiconductor substrate, a high current density can be applied, making it possible for the light-emitting device to emit light with high luminance (and high luminous flux). Also, by forming the nitride semiconductor substrate from GaN or $Al_xGa_{1-x}N$ (0<=x<=1), it is possible to form an LED serving as a light-emitting device using a nitride semiconductor substrate with good heat conductivity, i.e., good heat dissipation properties. Thus, since adequate heat dissipation can take place even when a high current density is applied, it is possible to reduce the possibility that the LED will be damaged by heat. Thus, a light-emitting device can be implemented in which light can be output in a stable manner over a long period of time.

In the light-emitting device described above, the sections (the curved surface sections 93) on which surface treatment has been performed can be sections that have been made smooth by using reactive ion etching as the surface treatment method.

When performing reactive ion etching on the second main surface 1a, a surface layer of the second main surface 1a having a predetermined thickness including the inner perimeter surfaces of the grooves 80 is removed, and the surface of the second main surface 1a (the surfaces of the side walls forming the inner perimeter surface of the grooves 80 and the sections of the surface on which the grooves 80 are not formed) after etching can be easily made smooth. Besides the reactive ion etching described above, any method can be used for the surface treatment operation as long as the second main surface 1a including the inner perimeter surfaces of the grooves 80 can be made smooth. For example, it would be possible to perform surface treatment through wet etching using acid solution or an alkali solution (e.g., KOH or NaOH), laser processing, other dry etching, ion milling, sputter etching, or the like.

In the light-emitting device described above, the nitride semiconductor substrate can be the GaN substrate 1. The GaN substrate 1 is n-typed through oxygen doping, and the oxygen concentration can be at least 1E17 ($1 \times 10^{17}$) oxygen atoms/cm$^3$ and no more than 2E19($2 \times 10^{19}$)/cm$^3$. In this case, current can flow uniformly through the entire GaN substrate 1, making it possible for light to exit adequately from roughly the entire second main surface of the GaN substrate 1.

Regarding the oxygen concentration of the GaN substrate 1 serving as the nitride semiconductor substrate, if the oxygen concentration exceeds 2E19/cm$^3$, the transmittivity of the GaN substrate 1 for light (especially blue light) is reduced, resulting in lower light transmittivity of the GaN substrate 1. Also, if the oxygen concentration in the GaN substrate 1 is less than 1E17/cm$^3$, the specific resistance of the GaN substrate 1 is reduced so that the current supplied from electrodes to the GaN substrate 1 does not achieve adequate coverage for the light-emitting layer 4. As a result, light output from the light-emitting device is reduced.

In the light-emitting device described above, the surface roughness of the sections (the curved surface sections 93) on which surface treatment has been performed can have an Ra of no more than 10 nm. In this case, since the surfaces at the sections on which surface treatment has been performed have adequate smoothness, the degree to which light transmittivity is reduced in the nitride semiconductor substrate due to the surface state of the sections can be limited to a degree that is negligible in practice. As a result, the light extraction efficiency from the second main surface 1a can be improved.

In this light-emitting device, out of the light transmitted from the first main surface of the nitride semiconductor substrate by way of the sections that have undergone surface treatment, the transmittivity of light with a wavelength of at least 420 nm and no more than 480 nm can be at least 50 percent.

If the transmittivity for the light with the above wavelengths is less than 50 percent at the sections that have undergone surface treatment (the curved surface sections 93 of the side walls of the grooves 80), absorption and reflection of light at the sections at which the grooves 80 are formed actually increases even if surface treatment is performed on the sections on which the grooves 80 are formed. Thus, if the light transmittivity for the above wavelengths is less than 50 percent, there is reduced light extraction efficiency at these sections. Thus, by having the light transmittivity at the sections that have undergone surface treatment as described above be at least 80 percent, this reduction in light extraction efficiency can be prevented. The reason for using the above light wavelength range of at least 420 nm and no more than 480 nm for studying transmittivity is that the light exiting from the light-emitting layer 4 in the light-emitting device has a wavelength that is covered by this wavelength range.

A method for making the light-emitting device described above is a method for making a light-emitting device equipped with a nitride semiconductor substrate that includes: a groove forming step (S20) and a surface treatment step (S30). In the groove forming step (S20), dicing is performed to form the grooves 80 on the second main surface 1a, which is opposite from the first main surface of the nitride semiconductor substrate on which the light-emitting layer 4 is formed. This makes it possible to provide a light-emitting device according to the present invention.

In the method for making the light-emitting device described above, in the surface treatment step (S30), it would be preferable for the surface layer of the inner perimeter surfaces of the grooves 80 to be removed by performing reactive ion etching. In this case, since the inner perimeter surfaces of the grooves 80 can be reliably smoothed, a light-emitting device can be provided with a light extraction efficiency that is higher than that of the conventional technology.

In the method for making the light-emitting device described above, in the surface treatment step (S30), the thickness of the surface layer to be removed by reactive ion etching from the inner perimeter surfaces of the grooves 80 can be greater than the average diameter of the abrasion grains contained in the dicing blade used in the groove forming step (S20).

This makes it possible, in the surface treatment step (S30), to reliably remove the indentations and projections having a size corresponding to the abrasion grain diameter of the dicing blade formed on the inner perimeter surfaces of the grooves 80 as a result of the dicing operation performed in the groove forming step (S20). As a result, the inner perimeter surfaces of the grooves 80 can be reliably made smooth.

In the method for making a light-emitting device described above, in the surface treatment step (S30), the reactive gas used in reactive ion etching can contain chlorine gas. This makes it possible to reliably smooth the inner perimeter surfaces of the grooves 80 formed on the nitride semiconductor substrate.

In the nitride semiconductor substrate (the GaN substrate 1) according to the present invention, the grooves 80 are formed on one of the main surfaces, as shown in FIG. 11 and the inner perimeter surfaces of the grooves 80 include sections that have undergone surface treatment in order to smooth the inner perimeter surfaces (the curved surface sections 93 in FIG. 13 and FIG. 14).

When this nitride semiconductor substrate is used in a light-emitting device, the use of the main surface on which the grooves 80 are formed as the light exit surface makes it possible to provide a light-emitting device with high light extraction efficiency.

In the nitride semiconductor substrate described above, the sections that undergo surface treatment can be sections that are smoothed through surface treatment in the form of reactive ion etching. This makes it possible to reliably smooth the inner perimeter surfaces of the grooves 80 through surface treatment.

The nitride semiconductor substrate described above can be a GaN substrate, and this GaN substrate 1 can be n-typed through oxygen doping with an oxygen concentration in the range of at least 1E17 oxygen atoms/cm$^3$ and no more than 2E19/cm$^3$. This allows current to flow uniformly through the entire GaN substrate 1 so that if this GaN substrate 1 is used to make a light-emitting device, light can be adequately emitted from roughly the entire second main surface of the GaN substrate 1.

In the nitride semiconductor substrate described above, the grooves 80 can have a V-shaped cross-section. This makes it possible to form sloped side walls for the grooves 80 on the main surface 1a of the nitride semiconductor substrate. By using the nitride semiconductor substrate according to the present invention in a light-emitting device, light extracted from the side walls can exit more efficiently in the direction of the normal of the main surface 1a (the direction perpendicular to the main surface) compared to when the side walls of the grooves are roughly perpendicular to the main surface 1a. As a result, a light-emitting device with high light usage efficiency can be provided.

In the nitride semiconductor substrate described above, the depth of the grooves 80 can be at least 50 microns and no more than 300 microns, and the thickness along the nitride semiconductor substrate thickness axis where the grooves 80 are not formed can be at least 100 microns and no more than 600 microns. When this nitride semiconductor substrate is used in a light-emitting device, the side walls of the grooves 80, which serve as part of the light exit surface, will have adequate area. This makes it possible to provide a light-emitting device that allows an adequate amount of light to be extracted from the exit surface.

In the nitride semiconductor substrate described above, the section on which the surface treatment is performed (the sections on which the curved sections 93 are formed on the side walls of the grooves 80) can have a surface roughness with an Ra of at least 10 nm. In this case, since the sections on which surface treatment is performed has adequate smoothness, the degree to which light transmittivity is reduced in the nitride semiconductor substrate due to the state of the surface sections can be kept to a negligible amount in practice. As a result, when a light-emitting device is prepared using this nitride semiconductor substrate, a high light extraction efficiency can be achieved for the light-emitting device.

In this nitride semiconductor substrate, for the light transmitted from the main surface opposite from the main surface 1a, on which the grooves 80 are formed, by way of the sections on which the grooves 80 are formed, the transmittivity for the wavelength range of at least 420 nm and no more than 480 nm can be at least 50 percent. In this case, when a light-emitting device is made using this nitride semiconductor substrate, good light extraction efficiency can be obtained with the light-emitting device.

The embodiments and examples of the present invention were described above, but these embodiments and examples of the present invention are simply examples and the scope of the present invention is not restricted to these embodiments. The scope of the invention is indicated by the claims of the invention and covers equivalences to the claims of the invention and all modifications within the scope.

In the light-emitting device according to the present invention, a nitride semiconductor substrate with high conductivity is used, grooves are formed on the light exit surface, surface treatment is performed on the surface on which these grooves are formed in order to smooth the surface, and a p-down mounted structure is used. As a result: (1) light extraction efficiency can be improved; (2) superior heat dissipation is provided while high-output light emission is made possible without requiring a complex electrode structure; (3) superior conductivity is provided while large-area light emission and high electrostatic withstand voltage is provided without requiring a protective circuit for protecting the light-emitting element from transient voltages and electrostatic discharge; (4) total internal reflection tends not to occur between the light-emitting layer and the release surface since there are no significant discontinuities going from high to low in the index of refraction going from the light-emitting layer to the substrate, thus preventing reduced efficiency and resin degradation at the side surfaces caused by total internal reflection; (5) since light is emitted with low voltages, there is no need for a high capacity power supply, thus making the device suitable for automotive illumination devices; (6) because the structure is simple, production is easy and inexpensive and maintenance is easy as well. Thus, it can be expected that the present invention can be used widely in different types of illumination products including automotive illumination devices.

What is claimed is:

1. A light-emitting device comprising:
   a GaN substrate;
   an n-type nitride semiconductor layer on a first main surface side of said GaN substrate;
   a p-type nitride semiconductor layer positioned further from said GaN substrate compared to said n-type nitride semiconductor layer; and
   a light-emitting layer positioned between said n-type nitride semiconductor layer and said p-type nitride semiconductor layer, wherein
   said p-type nitride semiconductor layer side is down-mounted and light is released from a second main surface, which is a main surface opposite from said first main surface of said GaN substrate;
   a plurality of grooves are formed on said second main surface of said GaN substrate; and
   an inner perimeter surface of each groove undergoes surface treatment in order to smooth said inner perimeter surface;
   each groove has a V-shaped cross section;
   each groove has a depth of at least 50 microns and no more than 300 microns; and
   along a thickness axis of said GaN substrate, a thickness of sections on which each groove is not formed is at least 100 microns and no more than 600 microns; and
   said GaN substrate is n-typed through oxygen doping, with an oxygen concentration that is at least 1 E17 oxygen atoms/cm$^3$ and no more than 2 E19 oxygen atoms/cm$^3$.

2. A light-emitting device according to claim 1 wherein said groove is formed by a dicing operation using a dicing blade; said section on which surface treatment is performed is a section obtained by removing a surface layer of said inner perimeter surface of said groove; and a thickness of said removed surface layer is greater than an average diameter of abrasive grains contained in said dicing blade.

3. A light-emitting device according to claim 1 wherein said section undergoing said surface treatment is a section that is smoothed through said surface treatment in the form of reactive ion etching.

4. A light-emitting device according to claim 1 wherein sections that have undergone said surface treatment have a surface roughness with an Ra of no more than 10 nm.

5. A light-emitting device according to claim 1 wherein, in said nitride semiconductor substrate, of light transmitted from said first main surface by way of said sections that have undergone said surface treatment, light having a wavelength of at least 420 nm and no more than 480 nm has a transmittivity of at least 50 percent.

6. A light-emitting device according to claim 1, wherein each of the plurality of grooves extend fully between opposing edges of the GaN substrate.

7. A light-emitting device according to claim 6, wherein ones of the plurality of grooves extend in a direction orthogonal to others of the plurality of grooves.

* * * * *